United States Patent
Katoh et al.

(10) Patent No.: US 9,803,291 B2
(45) Date of Patent: Oct. 31, 2017

(54) CRUCIBLE FOR GROWING SAPPHIRE SINGLE CRYSTAL, AND METHOD FOR PRODUCING CRUCIBLE FOR GROWING SAPPHIRE SINGLE CRYSTAL

(71) Applicant: A.L.M.T. Corp., Tokyo (JP)

(72) Inventors: Masahiro Katoh, Toyama (JP); Makoto Watanabe, Toyama (JP)

(73) Assignee: A.L.M.T. Corp., Tokyo (JP)

( * ) Notice: Subject to any disclaimer, the term of this patent is extended or adjusted under 35 U.S.C. 154(b) by 289 days.

(21) Appl. No.: 14/430,591

(22) PCT Filed: Sep. 12, 2013

(86) PCT No.: PCT/JP2013/074641
§ 371 (c)(1),
(2) Date: Mar. 24, 2015

(87) PCT Pub. No.: WO2014/050585
PCT Pub. Date: Apr. 3, 2014

(65) Prior Publication Data
US 2015/0225870 A1    Aug. 13, 2015

(30) Foreign Application Priority Data

Sep. 28, 2012 (JP) .................. 2012-217115

(51) Int. Cl.
*C30B 11/02* (2006.01)
*C30B 11/00* (2006.01)
(Continued)

(52) U.S. Cl.
CPC .............. *C30B 11/002* (2013.01); *C23C 4/02* (2013.01); *C23C 4/08* (2013.01); *C23C 4/12* (2013.01); *C23C 4/18* (2013.01); *C30B 29/20* (2013.01); *C30B 35/002* (2013.01); *F27D 2005/0075* (2013.01); *Y10T 117/1092* (2015.01)

(58) Field of Classification Search
CPC ............................... C30B 11/00; C30B 11/02
See application file for complete search history.

(56) References Cited

U.S. PATENT DOCUMENTS

2010/0139550 A1    6/2010    Aichele et al.
2010/0154703 A1    6/2010    Tsuji et al.
2013/0239882 A1*   9/2013    Bramhall, Jr. .......... C23C 16/18
                                                           117/223

FOREIGN PATENT DOCUMENTS

CN    101914805 A    12/2010
CN    102628184 A    8/2012
(Continued)

OTHER PUBLICATIONS

Frederick Schmid et al., "Producing Large Sapphire for Optical Applications", American Ceramic Society Bulletin, Feb. 1994, pp. 39-44, vol. 73, No. 2, Crystal Systems Inc.
(Continued)

*Primary Examiner* — Robert M Kunemund
(74) *Attorney, Agent, or Firm* — Sughrue Mion, PLLC (57) ABSTRACT

An object of this invention is to provide a crucible for growing a sapphire single crystal, which is optimized for providing a sapphire single crystal and is reusable. A crucible for growing a sapphire single crystal of this invention includes: a base material (3) containing molybdenum as a main component and having a crucible shape; and a coating layer (5) with which only an inner periphery of the base material (3) is coated and which is formed of tungsten and inevitable impurities, in which the coating layer (5) has a surface roughness Ra of 5 µm or more and 20 µm or less.

16 Claims, 9 Drawing Sheets

(51) Int. Cl.

| | | |
|---|---|---|
| *C30B 29/20* | (2006.01) | |
| *C30B 35/00* | (2006.01) | |
| *C23C 4/02* | (2006.01) | |
| *C23C 4/08* | (2016.01) | |
| *C23C 4/12* | (2016.01) | |
| *C23C 4/18* | (2006.01) | |
| *F27D 5/00* | (2006.01) | |

(56) References Cited

FOREIGN PATENT DOCUMENTS

| | | |
|---|---|---|
| JP | 6-25855 A | 2/1994 |
| JP | H0710546 A | 1/1995 |
| JP | 7-62538 A | 3/1995 |
| JP | 7-102376 A | 4/1995 |
| JP | 2004-299927 A | 10/2004 |
| JP | 2010-132544 A | 6/2010 |
| JP | 2012-107782 A | 6/2012 |

OTHER PUBLICATIONS

Günter Petzow, "Metallographic Etching", AGNE, 1977, pp. 8-11, pp. 16-19, pp. 56-61.
International Search Report for PCT/JP2013/074641 dated Nov. 26, 2013.
Office Action issued in corresponding Chinese Patent Application No. 2016083002608780 dated Sep. 2, 2016.

\* cited by examiner

CRUCIBLE FOR GROWING SAPPHIRE SINGLE CRYSTAL, AND METHOD FOR PRODUCING CRUCIBLE FOR GROWING SAPPHIRE SINGLE CRYSTAL

CROSS REFERENCE TO RELATED APPLICATIONS

This application is a National Stage of International Application No. PCT/JP2013/074641 filed Sep. 12, 2013, claiming priority based on Japanese Patent Application No. 2012-217115, filed Sep. 28, 2012, the contents of all of which are incorporated herein by reference in their entirety.

TECHNICAL FIELD

This invention relates to a crucible for growing a sapphire single crystal and a method of producing a crucible for growing a sapphire single crystal.

BACKGROUND ART

A sapphire single crystal is a material excellent in transmittance and mechanical characteristics. For example, the sapphire single crystal is in widespread use as an optical material, and in increasing use as an epitaxial substrate for GaN growth.

The sapphire single crystal has heretofore been obtained by being grown from a seed crystal using a crucible made of iridium, tungsten, or molybdenum and using the pulling method (also called the Czochralski method, the CZ method, or the like), the edge-defined film-fed growth (EFG) method, or the Kyropoulos method.

Of those, molybdenum is inexpensive as compared to iridium and tungsten, and hence has been widely used as a material for the crucible.

Meanwhile, sapphire has a melting point of more than 2,000° C. Accordingly, when molybdenum is used in the crucible, it is necessary to improve heat resistance of the crucible.

As a technology for improving the heat resistance of the crucible in which molybdenum is used, there is known a technology involving coating an outer periphery of molybdenum with a film of tungsten or the like having a higher melting point than that of molybdenum (Patent Document 1).

In addition, there is also known a technology involving doping molybdenum with elemental lanthanum or lanthanum oxide (Patent Document 2).

Further, there is also known a technology involving coating molybdenum with tungsten and then subjecting the resultant to heating treatment to form a solid solution layer of tungsten and molybdenum (Patent Document 3).

In addition, there is also known a technology involving forming a metal foil, which does not react with a melt and has a melting point of 1,800° C. or more, on the molybdenum crucible in a separable manner (Patent Document 4).

Meanwhile, in recent years, the sapphire single crystal has been increased in size for an improvement in yield of sapphire, resulting in emergence of a sapphire single crystal having such a size that the sapphire single crystal is difficult to grow by the related-art sapphire single crystal production method such as the pulling method described above.

Under such circumstances, a heat exchange method (HEM) has found use as a growth method applicable to such increase in size of the sapphire single crystal (Non Patent Document 1).

CITATION LIST

Patent Literature

[Patent Literature 1] JP H06-25855 A
[Patent Literature 2] JP H07-62538 A
[Patent Literature 3] JP H07-102376 A
[Patent Literature 4] JP 2010-132544 A Non-Patent Literature

[Non-Patent Literature 1] Frederick Schmid, Chandra P. Khattak, and D. Mark Felt, "Producing Large Sapphire for Optical Applications", American Ceramic Society Bulletin, February 1994 Volume 73, No. 2, p 39-44.

SUMMARY OF THE INVENTION

Problem to be Solved by the Invention

However, none of the technologies disclosed in Patent Documents 1 to 4 is a technology optimized for providing a sapphire single crystal. Accordingly, particularly in the growth of a sapphire single crystal using the HEM as disclosed in Non Patent Document 1, a problem has occurred in that a crucible needs to be disposed of after being used once.

In addition, as described above, in recent years, sapphire to be produced has been increased in size for an improvement in yield of sapphire. Along with this, a molybdenum crucible for growing sapphire has also been increased in size. Among sapphire growth conditions, a temperature of 2,050° C. or more for melting alumina is necessarily needed, and moreover, a crucible that withstands a weight and a pressure at the temperature is needed.

For example, the bottom surface of a crucible containing an alumina melt for sapphire having a depth of 300 mm is subjected to a pressure of 120 $g/cm^2$, i.e., 11.7 MPa caused by alumina, which has a density of 4 $g/cm^3$. Therefore, the crucible needs to be designed in consideration of the adhesion strength and pressure of alumina in view of a problem that has not occurred at a pressure of 40 $g/cm^2$ caused by a melt having a depth of about 100 mm, which is a technological level of the related art.

However, as described above, none of the technologies disclosed in Patent Documents 1 to 4 is a technology optimized for providing a large sapphire single crystal, and hence there has been a problem in that none is optimized for the increase in size of the crucible.

This invention has been made in view of the above-mentioned problems, and an object of this invention is to provide a crucible for growing a sapphire single crystal, which is optimized for providing a sapphire single crystal and is reusable.

Means to Solve the Problem

With a view to achieving the above-mentioned object, the inventors of this invention have reconsidered conditions required of a crucible in order to provide a crucible for growing a sapphire single crystal, which is optimized for providing a sapphire single crystal and is reusable, in particular, the shape and structure of an inner peripheral surface of the crucible to be brought into contact with sapphire.

As a result, the inventors have found that the crucible can be optimized for providing a sapphire single crystal by properly designing the shape and structure of the inner peripheral surface of the crucible, in particular, by forming a coating layer having a predetermined structure on the inner peripheral surface of the crucible. Thus, this invention has been attained.

According to a first aspect of the present invention, there is provided a crucible for growing a sapphire single crystal, comprising: a base material containing molybdenum as a main component and having a crucible shape; and a coating layer with which an inner periphery of the base material is coated and which is formed of tungsten and inevitable impurities, wherein the coating layer has a surface roughness Ra of 5 μm or more and 20 μm or less.

According to a second aspect of the present invention, there is provided a method of producing the crucible for growing a sapphire single crystal of the first aspect, the method comprising: (a) subjecting an inner periphery of a base material containing molybdenum as a main component and having a crucible shape to shot blasting; and (b) forming a coating layer formed of tungsten and inevitable impurities on the inner periphery of the base material by thermal spraying.

Effect of the Invention

According to one embodiment of this invention, it is possible to provide the crucible for growing a sapphire single crystal, which is optimized for providing a sapphire single crystal and is reusable.

MODES FOR EMBODYING THE INVENTION

Preferred embodiments of this invention are described in detail below with reference to the drawings.

First, the shapes of a crucible 1 for growing a sapphire single crystal according to embodiments of this invention are described with reference to FIG. 1 and FIG. 2.

Figure 1:
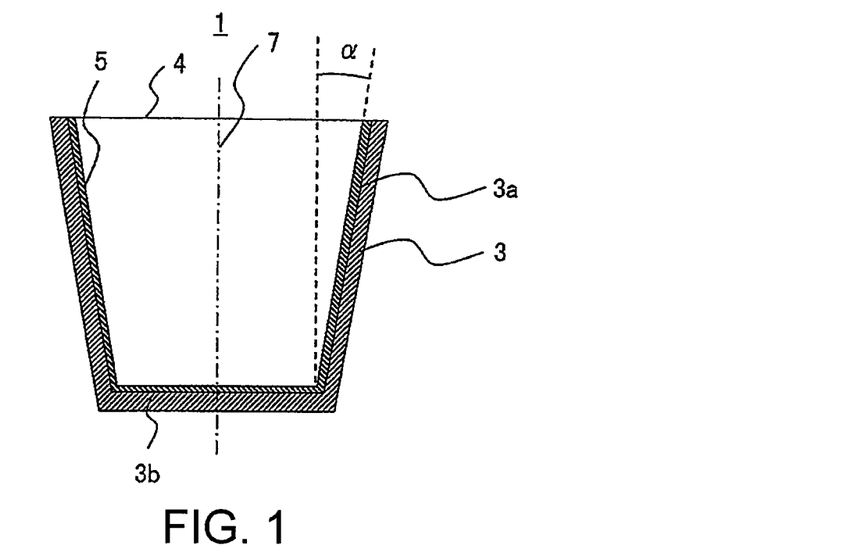
FIG. 1 is a cross-sectional view illustrating a crucible 1 for growing a sapphire single crystal.
Figure 2:
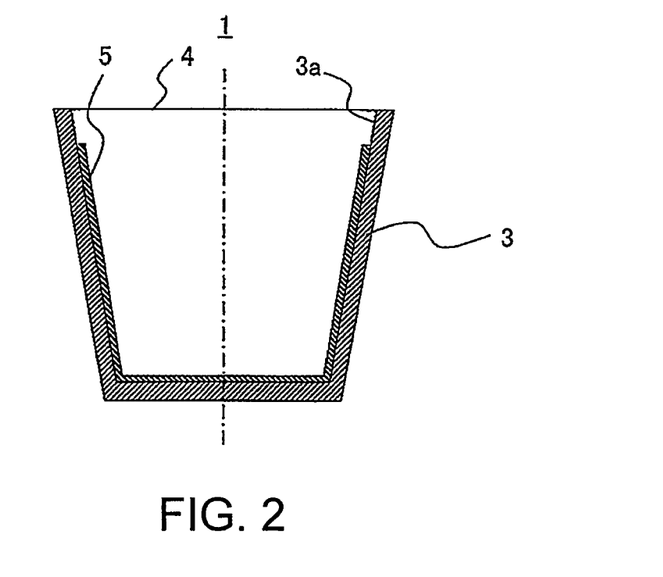
FIG. 2 is a cross-sectional view illustrating a modification of the crucible 1 for growing a sapphire single crystal.

In FIG. 1 and FIG. 2, a crucible for growing a single crystal by the HEM is illustrated as an example of the crucible 1 for growing a sapphire single crystal.

As illustrated in FIG. 1, the crucible 1 for growing a sapphire single crystal includes a base material 3 having a crucible shape and a coating layer 5 of tungsten with which an inner periphery of the base material 3 is coated.

Now, description is given of the composition and shape of each of the constituent members of the crucible 1 for growing a sapphire single crystal, and a method of producing the crucible 1 for growing a sapphire single crystal.

<Base Material 3>

The base material 3 has a crucible shape, is a material excellent in heat resistance, and is formed of molybdenum and inevitable impurities in this embodiment. However, a tungsten-molybdenum alloy having higher high-temperature strength by virtue of doping with tungsten, which has a higher melting point than that of molybdenum, may be used. Further, molybdenum doped with lanthanum or an oxide thereof may be used so that crystal grains have an interlocking structure. The presence of such structure can further improve heat resistance.

This is because, as described later, by virtue of the presence of the coating layer 5 in the crucible 1 for growing a sapphire single crystal, even when thermally sprayed tungsten and molybdenum are alloyed through interdiffusion due to heat at the time of sapphire growth, lanthanum is not precipitated to the surface and lanthanum oxide does not emerge on the surface to deteriorate the quality of sapphire. That is, lanthanum oxide remains in the molybdenum alloy of the base material 3 by virtue of the coating layer 5, and hence does not cause a risk of a reaction with sapphire or an adverse effect on the crystallization of sapphire.

As described above, the crucible 1 for growing a sapphire single crystal has an excellent feature in that the reaction between the dopant in the base material 3 and sapphire can be prevented. Accordingly, as a material for the base material 3, there may also be used titanium-zirconia-molybdenum (TZM), which is obtained by mixing a molybdenum material with dissimilar materials to improve high-temperature strength, or molybdenum added with HfC.

In addition, it is desired that an inner surface 3a of the base material 3 have a tapered shape that widens toward an opening 4 of the crucible (base material 3). Specifically, it is desired that a taper angle α of the inner surface 3a with respect to a central axis 7 of the crucible (base material 3) be 1° or more and less than 15°. This is because, as described later, it is desired that the coating layer 5 be formed by thermal spraying.

It should be noted that the thermal spraying of the coating layer 5 may be performed without the taper, but a taper angle of less than 1° is not preferred because with such taper angle, uniform thermal spraying of the coating layer 5 is difficult, and in terms of conditions for performing uniform thermal spraying while rotating the base material 3, under conditions of this invention, where the base material 3 is mounted onto a general-purpose lathe or a vertical lathe and the thermal spraying is performed with a plasma spray gun mounted onto a robot, the quality of the tungsten thermally sprayed film is extremely lowered owing to, for example, the involvement of tungsten particles remaining without contributing to the thermal spraying at the time of the thermal spraying during the thermal spraying. Specifically, tungsten that has not contributed to the thermal spraying adheres to the coating layer 5 in a particulate form and falls into sapphire during the melting of sapphire to become foreign matter in the single crystal.

On the other hand, a taper angle of 15° or more is not preferred because with such taper angle, yield is degraded for a reason of the formation of sapphire or an equipment factor.

In addition, typical dimensions of the base material 3 (crucible) are a thickness of from 2.5 to 6 mm, a size of 300 mm or more and 500 mm or less in diameter, and a depth of 300 mm or more and 500 mm or less. However, a further increase in size of the crucible to be caused by a further increase in size of the sapphire single crystal in the future is not precluded. It should be noted that when the coating layer 5 is formed by the thermal spraying, it is particularly desired in view of the operation of the thermal spraying or blasting to be described later that the diameter be 300 mm or more. In addition, the depth is not limited in view of the operation, but the effects of this invention are obtained for a crucible having a depth of 200 mm or more in association with the above-mentioned pressure (pressure on a bottom surface 3b of the crucible caused by molten alumina).

<Coating Layer 5>

The coating layer 5 is a material for preventing a reaction between molten sapphire and the base material 3 and imparting heat resistance to the crucible.

In this embodiment, the coating layer 5 is a layer formed of pure tungsten, which has the highest melting point among the metal elements, i.e., tungsten and inevitable impurities. Specifically, it is desired to use tungsten having a purity of 99.9% or more. This is because: when the purity is less than 99.9%, a reaction between sapphire and the impurities adversely affects the quality of sapphire to be obtained; and a lower purity leads to a lower melting point.

That is, in the thermal spraying of the coating layer 5 to be described later, a temperature at which tungsten melts is reached. Consequently, the impurities are, for example, sublimated or evaporated. Therefore, even a purity of about 99% does not cause any problem. However, it has been substantially necessary to use pure tungsten, which has the highest melting point among all metals. Thus, the coating layer 5 is substantially tungsten.

In addition, in order that the formed sapphire single crystal can be taken out without the destruction of the crucible (that is, the crucible may be reusable), it is desired that the coating layer 5 have a surface roughness Ra (arithmetic average roughness) of 5 μm or more and 20 μm or less.

A surface roughness Ra of the coating layer 5 of less than 5 μm is not desired because with such surface roughness Ra, the sapphire single crystal is not easily separated from the coating layer 5, and the sapphire single crystal cannot be taken out without the destruction of the crucible.

On the other hand, the coating layer 5 that has an Ra of more than 20 μm is not desired because its formation is difficult industrially, and even when formed, the coating layer 5 is not stable in quality and the coating layer 5 may be separated from the base material 3.

It should be noted that the bottom surface 3b of the crucible (see FIG. 1) is where a seed crystal is placed in the growth of a sapphire single crystal using the HEM method, and hence may be a mirror surface, and at least 50% or more of a portion to be brought into contact with sapphire such as a side wall only needs to have an Ra of 5 μm or more.

Further, in order to facilitate the separation of the sapphire single crystal from the crucible, it is desired that the coating layer 5 have in itself pores. As a specific number of pores, it is desired that the number of pores each having an area of $1 \times 1$ μm$^2$ or more in a region of $50 \times 50$ μm in a cross-section of the base material 3 in an axial direction (plane passing through the central axis 7 and parallel to the central axis 7) be 10 or more and less than 100.

A number of pores of less than 10 is not desired because with such number of pores, the sapphire single crystal is extremely difficult to separate from the crucible, and the crucible is not reusable (the sapphire single crystal cannot be taken out without the destruction of the crucible). This is probably due to an increase in thermal conduction between molybdenum and sapphire via tungsten, and to suction of sapphire based on capillary action that forms a gap at an interface between sapphire and the crucible.

On the other hand, a number of pores of more than 100 is not desired because with such number of pores, the density of the coating layer 5 is so low as to cause a problem in terms of adhesion property, and the coating layer 5 may be easily separated from the base material 3 or may stick to sapphire.

As described above, when the coating layer 5 has in itself an appropriate number of pores, during the growth of the sapphire single crystal, alumina grains remain in the pores so as to be present in the coating layer 5, thereby, for example, appropriately controlling thermal conduction and inhibiting thermal expansion, which is effective for the separation of the formed single crystal sapphire.

It should be noted that as described above, alumina grains may be present in the pores in the crucible that has been used in the growth of sapphire one or more times.

In addition, the pores may be observed by: cutting part of the crucible to expose a cross-section of the base material 3 in the axial direction; performing known resin embedding, grinding, and etching for metal morphology observation; and observing the cross-section with a known electron microscope. Further, as described above, similar observation may be performed by cutting the crucible after use instead of the crucible before use, but in that case, alumina grains may be observed at portions corresponding to the pores.

Further, regarding the observation region, a square observation region of $50 \times 50$ μm may be difficult to obtain depending on the thickness of the coating layer 5. In such case, any other shape than the square, such as a rectangle, may be adopted as the observation region as long as the region corresponds to (has the same area as) the area of the square region of $50 \times 50$ μm.

In addition, it is desired that the thickness of the coating layer 5 be 50 μm or more and 300 μm or less. This is because: a thickness of less than 50 μm does not provide the effect of the formation of the coating layer 5; and a thickness of more than 300 μm is economically costly, and moreover, may cause the separation of the coating layer 5 from the base material 3. In particular, a thickness of more than 500 μm is not preferred because with such thickness, the separation of the coating layer 5 is more probable, and in particular, the surface separation may occur even when heat treatment for suppressing the emission of gas (details are described later) is performed.

Further, it is desired, in terms of industrial mass-productivity and cost reduction as well, to form the coating layer 5 only on the inner surface.

Figure 3:
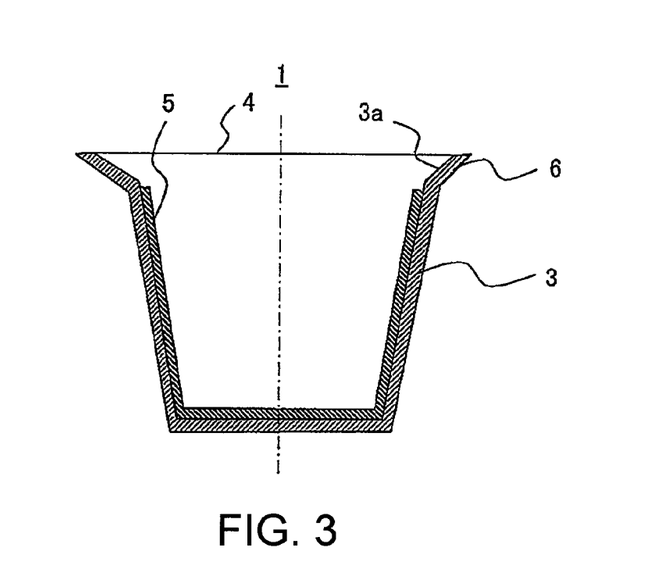
FIG. 3 is a cross-sectional view illustrating a modification of the crucible 1 for growing a sapphire single crystal.

In addition, with the coating layer 5, at least a region to be brought into contact with sapphire only needs to be coated, and hence the entire inner periphery does not necessarily need to be coated. As illustrated in FIG. 2, only a region corresponding to the height of sapphire may be coated. In this case, as illustrated in FIG. 3, the shape of the base material 3 around the opening 4 may be a shape in which a brim 6 is formed at the opening 4. It is no problem if the coating layer 5 is formed to the opening as in FIG. 1. When such shape is adopted, as compared to the structures of FIG. 1 and FIG. 2, part of processes during the formation of the crucible such as a cutting process can be omitted to reduce production cost.

It should be noted that at a temperature of from 2,050 to 2,300° C., at which the sapphire single crystal is grown, in effect, the tungsten of the coating layer 5 and the molybdenum of the base material 3 interdiffuse, and even when tungsten is thermally sprayed to a thickness of 1,000 µm as the coating layer 5 in a time period of several days or more, which is a generally assumed growth condition for sapphire, the molybdenum element reaches the surface of the coating layer 5. This is because tungsten and molybdenum belong to the same crystal system and have approximately the same atomic radius, and hence form a complete solid solution. Thus, it is difficult to prevent the interdiffusion of tungsten and molybdenum. Accordingly, it is necessary to form a structure in which the interdiffusion of the materials for the coating layer 5 and the base material 3 is permitted as described above. It is also effective to use a tungsten-molybdenum alloy for the base material 3.

<Production Method>

A method of producing the crucible 1 for growing a sapphire single crystal of this invention is not particularly limited as long as the method allows the coating layer 5 to be formed efficiently and uniformly, and allows the surface roughness, pores, and the like of the coating layer 5 to fall within the above-mentioned ranges. For example, the crucible 1 for growing a sapphire single crystal may be produced by forming the coating layer 5 by chemical vapor deposition (CVD) or the like.

However, it is desired that the coating layer 5 be formed by thermal spraying, which is industrially inexpensive and excellent in mass-productivity. In view of this, referring now to FIG. 4 and FIG. 5, a production method involving using thermal spraying is described.

Figure 4:
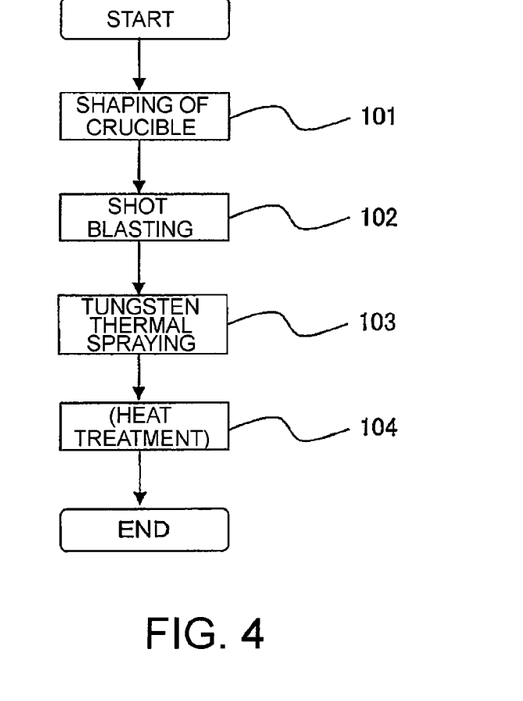
FIG. 4 is a flowchart illustrating the process of the production of the crucible 1 for growing a sapphire single crystal.

First, molybdenum (or a tungsten-molybdenum alloy or molybdenum doped with lanthanum or an oxide thereof) that is to serve as the base material 3 is prepared, and shaped into a crucible shape (S101 of FIG. 4).

Next, the inner periphery of the base material 3 (surface on which the coating layer 5 is to be formed) is subjected to shot blasting to adjust its surface roughness (S102 of FIG. 4).

As a condition of the shot blasting, it is desired to use particles, such as alumina particles, including particles passing through a 20-mesh sieve and remaining on a 60-mesh sieve. This is because the use of particles remaining on a 20-mesh sieve results in a surface roughness Ra of the coating layer 5 of more than 20 µm, whereas the use of only particles passing through a 60-mesh sieve does not result in a surface roughness Ra of the coating layer 5 of 5 µm or more.

It should be noted that materials other than alumina include SiC (Carborundum), WC, glass beads, glass powder, steel shots and steel grits, stainless-steel cut wires, steel cut wires, steel beads, stainless-steel beads, iron powder, ceramic beads, high hardness garnet, brown alumina, green silicon carbide, and black silicon carbide.

It should be noted that in order to adjust the surface roughness of the coating layer 5 to the above-mentioned value, it is desired to use, as the particles to be used for the blasting, a material that has a higher hardness than that of the base material 3 as a base (when the same blasting material comes in different kinds depending on hardness) and is unused.

In addition, in the shot blasting, it is desired to prevent the sprayed particles from remaining on the inner periphery. This is because when the particles remain on the inner periphery, a state in which the particles are sandwiched between the coating layer and the base material 3 is established during the formation of the coating layer 5, which may cause the expansion of the particles to form a bulging portion in the coating layer 5 or may cause the separation of the coating layer 5 from the base material 3 depending on the purity of the particles and the temperature at which the crucible 1 for growing a sapphire single crystal is used. Such phenomenon becomes more significant as the purity of the particles lowers.

Therefore, it is desired to perform treatment for removing the particles remaining on the inner periphery after the shot blasting.

In addition, it is desired that the purity of the particles be as high as possible in order to prevent the coating layer 5 from being separated from the base material 3 even when the particles remain.

Specific examples of the treatment for removing the remaining particles include, but are not necessarily limited to: (1) a method involving removing the particles by dissolving the surface of the base material 3 with a chemical solution; (2) a method involving evaporating the particles together with molybdenum in the surface of the base material 3 by performing heat treatment in a vacuum-atmosphere furnace; and (3) a method involving performing cleaning with ultrasonic or dry ice after the blasting.

The above-mentioned treatments are described in more detail below.

First, in (1) the method involving removing the particles by dissolving the surface of the base material 3 with a chemical solution, the base material 3 is immersed in, for example, aqua regia or a mixed liquid of hydrofluoric acid and nitric acid and kept therein for from 10 seconds to 30 minutes. The applicant of this application has successfully confirmed with an electron microscope and the like that the blasting particles are not uniformly removed unless being immersed in the chemical solution for 10 seconds or more, preferably 1 minute or more. Further, the applicant of this application has also confirmed that the unevenness of the surface is removed and the thermal spraying is not uniformly performed unless the time period for which the chemical solution treatment is performed is 30 minutes or less, preferably 20 minutes or less. It should be noted that the kind of the chemical solution is not limited as long as the chemical solution is capable of dissolving molybdenum, and examples thereof include various chemical solutions shown in "Metallographic Etching", authored by Gunter Petzow, AGNE, 1977, p 8-p 19, p 56-p 61.

Next, in (2) the method involving evaporating the particles together with molybdenum in the surface of the base material 3 by performing heat treatment in a vacuum-atmosphere furnace, the applicant of this application has confirmed that, for example, by performing heat treatment at 1,500° C. for 1 minute or more at a pressure of $10^4$ Pa (1/10 atm) or less, the surface of the base material 3 can be removed, and along with this, the blasting particles can be removed. It should be noted that a lower pressure (higher degree of vacuum) enables treatment at a lower temperature within a shorter time period, and the treatment can be performed even at a treatment temperature of 1,000° C. at minimum in some cases.

Next, in (3) the method involving performing cleaning with ultrasonic or dry ice after the blasting, in the case of using ultrasonic, the applicant of this application has confirmed that, for example, cleaning can be performed with pure water in a water tank loaded with a required amount of water at a frequency of 40 kHz through the use of an immersion-type ultrasonic cleaning machine SU-600B manufactured by SND Co., Ltd. or the like. In addition, in the case of using dry ice, the applicant of this application has confirmed that the blasting particles can be removed by cleaning under the conditions of 2 m³/min of air and 0.3 MPa through the use of a dry-ice cleaning machine TDSD-2 of Fuji Manufacturing Co., Ltd. or the like.

Next, tungsten is thermally sprayed onto the inner periphery of the base material 3 to form the coating layer 5 (S103 of FIG. 4).

Figure 5:
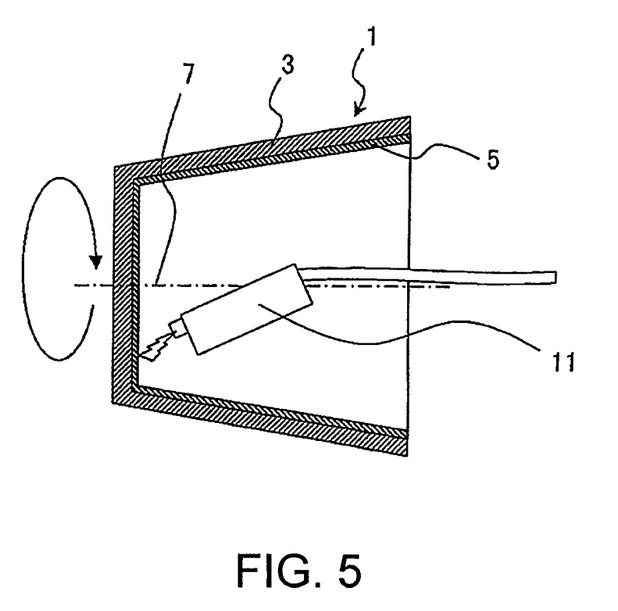
FIG. 5 is a side view for illustrating a method of forming a coating layer 5 by thermal spraying, in which the crucible 1 for growing a sapphire single crystal is illustrated in cross-sectional view.

Specifically, as illustrated in FIG. 5, the bottom surface of the base material 3 is held on a general-purpose lathe (not shown), and the coating layer 5 is formed by thermal spraying using a known plasma spray gun 11 or the like while the base material 3 is rotated about the central axis 7.

At this time, it is desired to set conditions of the thermal spraying to electric current conditions of from 65 V and 500 A to 80 V and 1,000 A and a moving speed of a thermal spraying nozzle of from 10 to 300 mm/sec. In order to form a uniform tungsten thermally sprayed layer (coating layer 5), it is desired to thermally spray the same region two or more times or to form the layer at a nozzle moving speed of 150 mm/sec or less. In addition, the supply amount of tungsten powder under those conditions is, for example, from 10 to 200 g/min.

In addition, in order to form the above-mentioned number of pores in the coating layer 5, a distance between the end of the thermal spraying nozzle to the base material 3 is preferably set to from 10 to 150 mm, more preferably from 20 to 60 mm.

This is because of the following reasons. When the distance is less than 10 mm, agglomeration at the time of the thermal spraying is increased, the porosity becomes extremely small to prevent the achievement of the above-mentioned number of pores, and it becomes extremely difficult to handle or operate the plasma spray gun in coating a radius. In addition, when the distance is more than 150 mm, tungsten for the thermal spraying is solidified or forms a mass in the air to cause a problem such as lowering of the adhesion property of the film or separation of the thermally sprayed film that has formed a mass, or to extremely lower yield by weight with respect to the loaded tungsten raw material.

In addition, as the deposition rate of the coating layer 5, an appropriate thermally sprayed film thickness is from 20 to 100 μm per scan. In order to increase the thickness, several scans may be performed to obtain a uniform thermally sprayed film, and the thickness may be appropriately adjusted. For example, the thermal spraying may be performed at a thermally sprayed film thickness of 25 μm 6 times to finally obtain a thermally sprayed film thickness of 150 μm.

In addition, in the thermal spraying, the content of oxygen in the coating layer 5 may be reduced by performing thermal spraying under reduced pressure. However, the thermal spraying may be performed in the atmosphere in order to be performed industrially inexpensively.

It should be noted that it is industrially preferred to use the surface obtained by the thermal spraying as it is without subjecting the surface of the coating layer 5 after the thermal spraying to processing such as grinding. However, as described above, the bottom surface 3b is where a seed crystal is placed in the HEM method, and hence the bottom surface 3b may be subjected to grinding so as to become smooth.

Next, as necessary, the crucible is subjected to heat treatment for removing gas (S104 of FIG. 4). The heat treatment is not essential, but it is desired that the heat treatment be performed in advance (at least before the crucible is used) in order to prevent the occurrence of a failure caused by air bubbles or oxidation at the time of sapphire growth.

It should be noted that in order to obtain the gas-removing effect of the heat treatment, it is necessary to perform the heat treatment at a temperature of 1,000° C. or more under the following atmosphere: a vacuum of $10^{-1}$ Pa or less or an atmosphere containing 30% or more of hydrogen. This is because: when the degree of vacuum is lower than that value (the pressure is higher), the oxidation of the coating layer 5 or the molybdenum crucible (base material 3) progresses; and in the case of hydrogen, which has a reducing property, although an inert gas such as nitrogen may be mixed, a hydrogen concentration of 30% or more is necessary to keep the reducing property. In addition, in order to reduce restrictions on an industrial heat treatment apparatus, it is desired that the temperature of the heat treatment be set to 2,200° C. or less. A treatment time of 5 minutes or more facilitates the control of overshoot. In addition, a longer time allows sufficient diffusion on the assumption of use conditions, but in consideration of an industrial cycle, a practical cycle is 10 hours or less, and in order to obtain more reliable productivity, 1 hour or less. Therefore, an appropriate heat treatment time is 5 minutes or more and 10 hours or less.

The description of the method of producing the crucible 1 for growing a sapphire single crystal ends here.

As described above, according to this embodiment, the crucible 1 for growing a sapphire single crystal includes the base material 3 having a crucible shape and the coating layer 5 of tungsten with which only the inner periphery of the base material 3 is coated, in which the coating layer 5 has a surface roughness Ra of 5 μm or more and 20 μm or less.

Thus, the crucible 1 for growing a sapphire single crystal is optimized for providing a sapphire single crystal and is reusable.

That is, through the formation of the tungsten thermally sprayed layer (coating layer 5) on the inner surface of the molybdenum crucible (base material 3) under appropriate conditions, particularly in sapphire growth in the molybdenum crucible by the HEM method, the molybdenum crucible, which has heretofore been capable of being used only once, can be repeatedly used, and the vapor deposition, absorption, mixing, or the like of molybdenum into the sapphire crystal is extremely reduced to improve the yield of the material, for example. Thus, the quality characteristics of the sapphire crystal can be improved economically inexpensively.

Further, according to this embodiment, the coating layer 5 of the crucible 1 for growing a sapphire single crystal has in itself 10 or more and less than 100 pores in a region corresponding to an area of 50×50 μm in a cross-section of the base material 3 in the axial direction.

Thus, the sapphire single crystal can be more easily separated from the crucible.

EXAMPLES

This invention is more specifically described below with reference to Examples.

Example 1

The crucible 1 for growing a sapphire single crystal in which the coating layer 5 was formed by the thermal spraying method was produced and used to melt sapphire, followed by cooling, and then an attempt was made to take sapphire out of the crucible. A specific process is as described below.

<Preliminary Test>

First, as a preliminary test, a crucible smaller than dimensions to which this invention was assumed to be applied was produced and used to melt alumina (sapphire raw material), and a comparison in ease of separation was made on the basis of surface roughness.

Specifically, first, a molybdenum small crucible having a diameter of 20 mm and a depth of 20 mm was prepared, and the inner periphery of the base material 3 was subjected to shot blasting with alumina particles passing through a 20-mesh sieve (opening size: 864 μm) or passing through a 60-mesh sieve (opening size: 221 μm). After that, the coating layer 5 was formed on the inner periphery of the base material 3 by thermal spraying using a plasma spray gun 9 MB manufactured by Sulzer Metco and using commercially available tungsten powder for thermal spraying having a purity of 99.9% and classified so as to have a particle size of from 45 to 75 μm. Finally, the resultant was subjected to heat treatment at 1,800° C. under a hydrogen atmosphere for 1 hour to obtain a crucible 1 for growing a sapphire single crystal, for a preliminary test.

The coating layer surface of the crucible was measured for its arithmetic average roughness Ra with Surfcorder SE-2300 manufactured by Kosaka Laboratory Ltd. under the condition of a drive speed of 0.5 mm/sec over a length of 10 mm. As a result, the crucible subjected to the shot blasting with the alumina particles passing through a 20-mesh sieve (opening size: 864 μm) was found to have a surface roughness Ra after the thermal spraying of 5.1 μm, i.e., an Ra of 5 μm or more. On the other hand, the crucible subjected to the shot blasting with the alumina particles passing through a 60-mesh sieve (opening size: 221 μm) was found to have a surface roughness Ra of 2.9 μm, i.e., an Ra of less than 5 μm.

Next, the crucible was used to melt alumina for 10 hours, and the ease of separation after cooling was examined.

The results were as follows: in the case of the surface having an Ra of 5.1 μm, alumina was able to be taken out without the application of a force, whereas in the case of the surface having an Ra of 2.9 μm, alumina was able to be taken out only when an impact having the potential to destroy the molybdenum crucible was applied.

<Evaluation Test for Surface Roughness>

Next, on the basis of the results of the preliminary test, a large crucible to which this invention was assumed to be applied was produced and used to melt alumina, and the relationship between the surface roughness of the coating layer 5 and the separability of sapphire was evaluated in more detail.

Specifically, first, a molybdenum crucible for growing sapphire having a diameter of 400 mm, a height of 400 mm, and a thickness of 5 mm was prepared as the base material 3, and the inner periphery of the base material 3 was subjected to shot blasting with alumina particles passing through a 20-mesh sieve (opening size: 864 μm) or passing through a 60-mesh sieve (opening size: 221 μm).

Next, the coating layer 5 was formed on the inner periphery of the base material 3 by thermal spraying using a plasma spray gun 9 MB manufactured by Sulzer Metco and using commercially available tungsten powder for thermal spraying having a purity of 99.9% and classified so as to have a particle size of from 45 to 75 μm. Finally, the resultant was subjected to heat treatment at 1,800° C. under a hydrogen atmosphere for 1 hour to obtain the crucible 1 for growing a sapphire single crystal.

The crucible was subjected to the measurement of the surface roughness of the coating layer 5 using the same apparatus and conditions as those in the preliminary test.

Further, the resultant crucible was used to melt alumina for 10 hours, followed by cooling, and then the ease of separation was examined.

Table 1 shows the results of the foregoing. It should be noted that Table 1 also shows the number of pores each having an area of 1×1 μm² or more in the coating layer 5 in a region of 50×50 μm in a cross-section of the base material 3 in the axial direction (details are described later).

TABLE 1

| Surface Roughness (Ra) | Pretreatment Blasting Particle Size | Characteristics | Remarks | (Number of Pores) |
|---|---|---|---|---|
| 4.5 μm | 60 mesh | Poor separability with probability of separation of 50% | Outside the scope of this invention | 48 |
| 5.6 μm | 60 mesh and then 20 mesh | Easily separated | This invention | 61 |
| 11 μm | 20 mesh | Easily separated | This invention | 52 |
| 29 μm | 20 mesh It should be noted that for comparison, the conditions of the thermal spraying were set so that the tungsten supply amount was excessive, specifically, 80 g/min. | The tungsten film is separated and the quality of sapphire is deteriorated. | Outside the scope of this invention | 90 |

As apparent from Table 1, in the case of the surface having an Ra of 5.6 μm or 11 μm, alumina was able to be easily taken out. In contrast, in the case of an Ra of 4.5 μm, alumina was not able to be taken out without the destruction of the molybdenum crucible at a probability of 50% (that is, one out of two crucibles). In addition, in the case of a surface roughness of 29 μm, the coating layer 5 was separated when alumina was taken out. That is, the samples each having an Ra of from about 5 μm to 20 μm allowed alumina to be easily separated, whereas the sample having an Ra of less than 5 μm degraded the separability and the sample having an Ra of more than 20 μm caused the separation of the coating layer 5.

These results and the results of the preliminary test revealed that in general tungsten thermal spraying, pretreatment was performed with blasting particles passing through a 60-mesh sieve, i.e., finer than 221 μm, followed by thermal spraying of tungsten, but under blasting conditions using coarse particles different from the general ones, there was a difference in ease of separation.

That is, it was found that the conditions of the shot blasting to be performed as pretreatment immediately before the tungsten thermal spraying were important for the control of the surface roughness.

More specifically, it was generally thought that a rough surface was a thermal conduction-inhibiting surface that was not suitable for the HEM method or the like, in which thermal conduction to the crucible was important, among sapphire growth methods. In actuality, even in a large crucible having a diameter of more than 300 mm, crystal growth was possible without any problem at an Ra of 5.1 µm, at which the crystal was able to be taken out according to the results of the preliminary test. In addition, it was found that adhesion between the crucible and sapphire did not occur, and the sapphire crystal, which had heretofore been taken out by destroying the molybdenum crucible, was able to be grown two or more times as long as the application of an impact due to the taking out was avoided by, for example, taking out the sapphire crystal by suction.

<Evaluation Test for Cross-Sectional Shape>

Next, in order to evaluate a relationship between a cross-sectional shape and separability, a crucible having the same dimensions as those in <Evaluation Test for Surface Roughness> was prepared, shot blasting was performed with alumina particles passing through a 20-mesh sieve (opening size: 864 µm), and the coating layer 5 was formed under various film formation conditions shown in Table 2 below (powder supply amount and nozzle moving speed). The crucible 1 for growing a sapphire single crystal was obtained under the same conditions as those in <Evaluation Test for Surface Roughness> except for the above-mentioned conditions, and was used to melt alumina.

Next, the cross-sectional shape of the coating layer 5 of the obtained crucible was observed.

Figure 6:
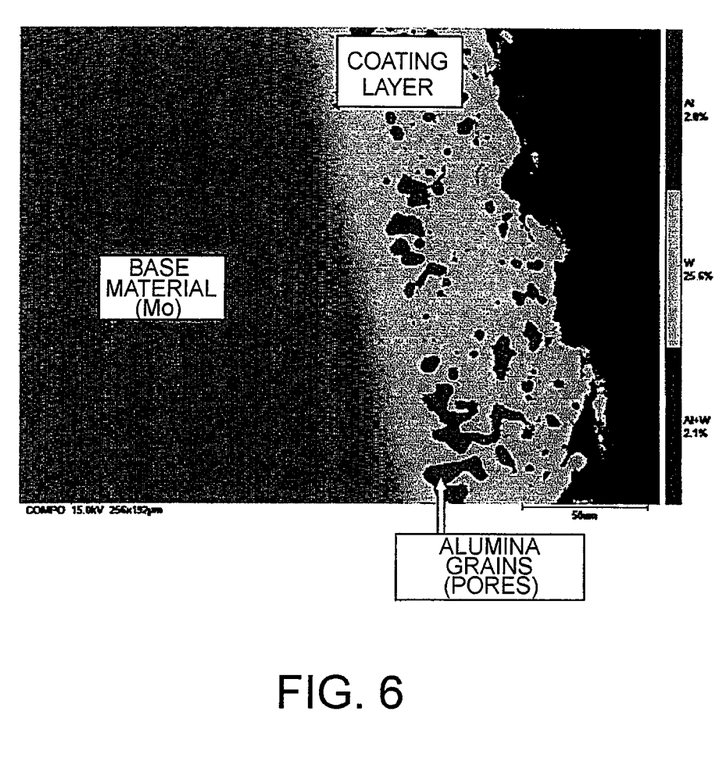
FIG. 6 is a micrograph showing an example of the cross-sectional morphology of the coating layer 5 after use (after alumina melting).
Figure 7:
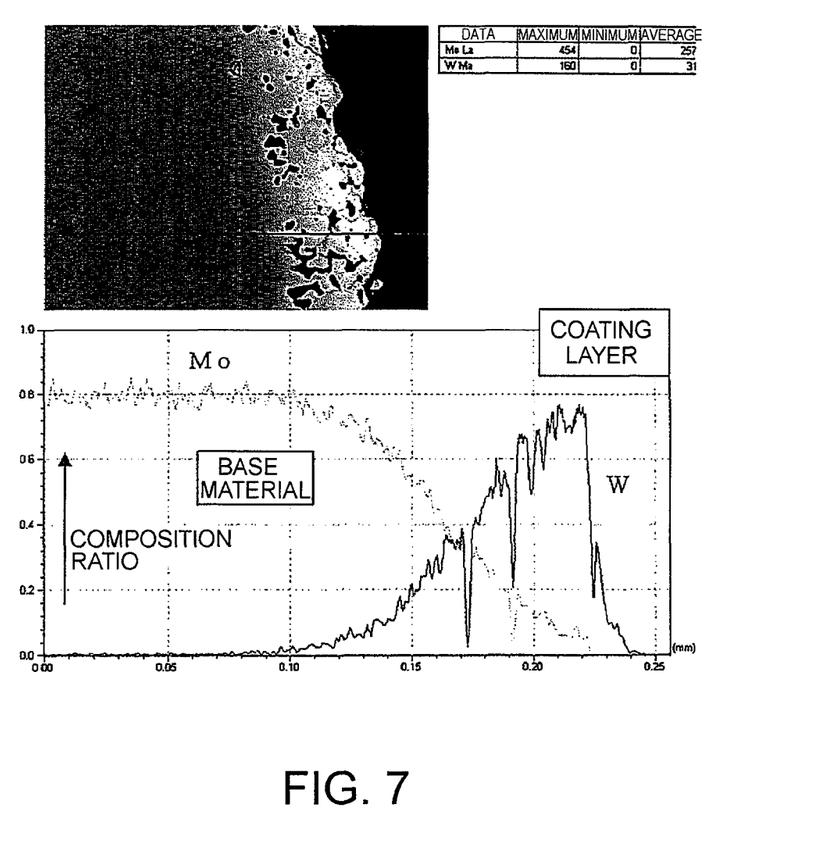
FIG. 7 is a micrograph and graph showing an example of the cross-sectional morphology and composition ratio of the coating layer 5 after use (after alumina melting).

Specifically, part of the obtained crucible was cut, and the cut piece was embedded in a known resin for metal morphology observation. The resultant was ground and etched, followed by observation of a 2500 µm$^2$ (50×50 µm) region with a known electron microscope to check the number of pores each having an area of 1×1 µm$^2$ or more that were observable with an electron microscope at a magnification of from about 500 to 5,000×. It should be noted that similar observation may be performed by cutting the crucible after use (after sapphire melting) instead of the crucible before use, but in that case, the number of alumina grains in portions corresponding to the pores is checked. FIG. 6 and FIG. 7 show examples of the cross-sectional morphology and composition ratio of the crucible 1 for growing a sapphire single crystal after use based on EPMA-1720 manufactured by SHIMADZU CORPORATION.

Table 2 shows the results obtained. It should be noted that Table 2 also shows the surface roughness of the coating layer 5 and the surface roughness Ra fell within the range of from 11 µm to 18 µm.

TABLE 2

| Number of Pores | Ease of separation from sapphire and characteristics | Remarks | Surface roughness | Film formation conditions |
|---|---|---|---|---|
| 5 | Poor separability with probability of separation of 50% | Outside the scope of this invention | 11 µm | Powder supply: 50 g/min/Nozzle moving speed: 8 mm/sec |
| 11 | Easily separated | This invention | 12 µm | Powder supply: 50 g/min/Nozzle moving speed: 50 mm/sec |
| 52 | Easily separated | This invention | 15 µm | Powder supply: 30 g/min/Nozzle moving speed: 200 mm/sec |
| 110 | The density of the tungsten film is so low that the thermally sprayed film is separated and the quality of sapphire is deteriorated. | Outside the scope of this invention | 18 µm | Powder supply: 10 g/min/Nozzle moving speed: 500 mm/sec |

As shown in Table 2, when the number of pores (after use, alumina grains) was less than 10 in the region of 2500 µm$^2$ (50×50 µm), the ease of taking out was lost as in a crucible made of molybdenum alone, and when the number of pores was more than 100, there were problems such as the separation of the tungsten thermally sprayed film due to its own low density, the occurrence of a problem in adhesion property, and sticking to sapphire. It should be noted that in the case of the absence of the pores (in the case of the alumina grains), even when the composition of 100% of tungsten was not maintained at the surface and even the surface was converted into a molybdenum alloy through interdiffusion due to heat treatment at the time of production or heat in use, the crucible was able to be used two or more times and the crystal was able to be taken out as long as the structure of the pores was kept.

The results revealed that when the coating layer 5 had in itself 10 or more and less than 100 pores in a region corresponding to an area of 50×50 µm in a cross-section in the base material 3 in the axial direction, the separation of sapphire was made easier.

Example 2

Figure 8:
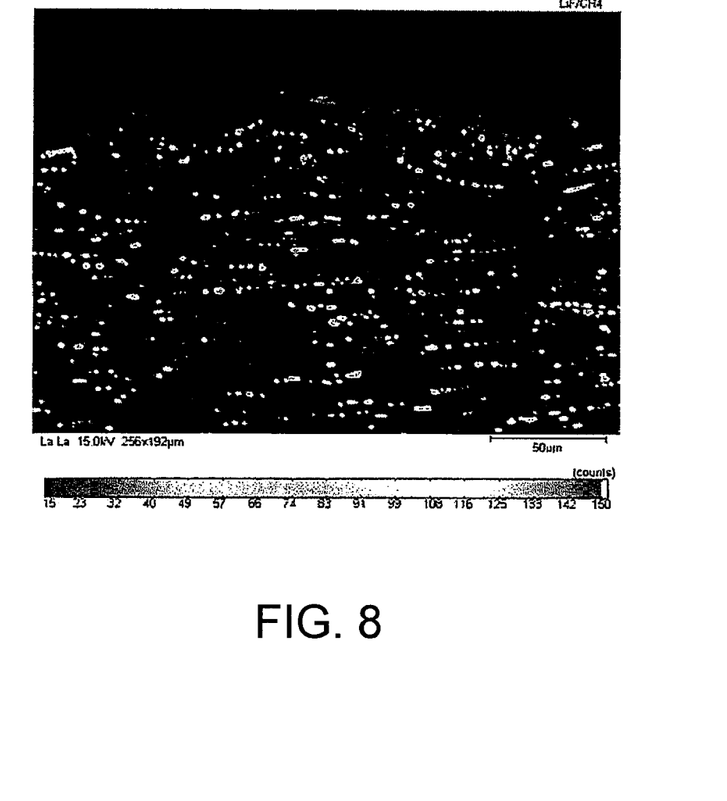
FIG. 8 is an example of a cross-sectional micrograph of a base material containing Mo doped with lanthanum oxide, the micrograph showing the distribution of La.
Figure 9:
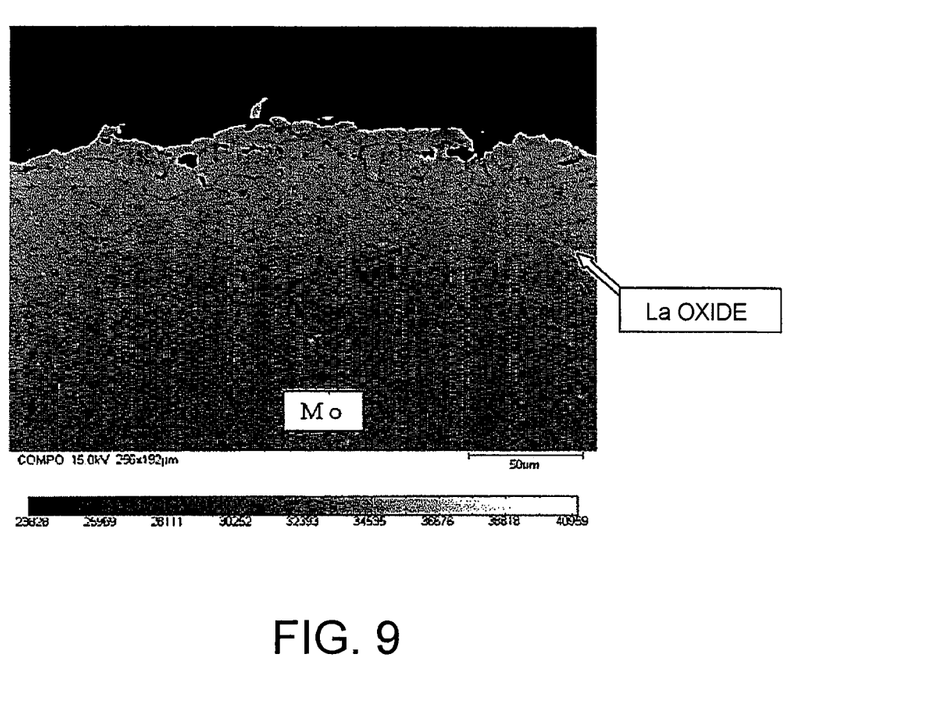
FIG. 9 is an example of the cross-sectional micrograph of the base material containing Mo doped with lanthanum oxide, the micrograph showing the morphology of Mo.
Figure 10:
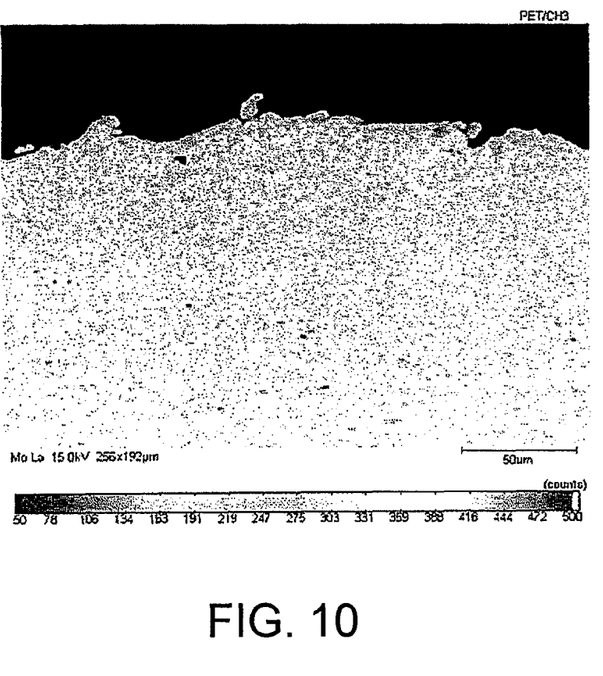
FIG. 10 is an example of the cross-sectional micrograph of the base material containing Mo doped with lanthanum oxide, the micrograph showing an analysis result of a Mo base.

In Example 1, a base material obtained by doping Mo with 0.3 to 2 mass % of lanthanum oxide, and intermittently dispersing the oxide along processing morphology to form a partial fibrous morphology was used as the base material 3, the coating layer 5 was formed, and an attempt was made to grow a sapphire single crystal. FIG. 8 to FIG. 10 show examples of observation results of the cross-section of the base material 3. It should be noted that FIG. 8 to FIG. 10 are the results of photographing with EPMA-1720H at an acceleration voltage of 15 kV, FIG. 8 shows the distribution of La, FIG. 9 shows a back scatter electron (BSE) image showing the morphology of Mo, and FIG. 10 shows a Mo base.

Next, with the use of this base material, a molybdenum crucible for growing sapphire having a diameter of 400 mm, a height of 400 mm, and a thickness of 5 mm was used to melt alumina (sapphire raw material) and a comparison in ease of separation was made on the basis of the cross-sectional shape and the surface roughness in the same manner as in Example 1. Before the coating was performed, there had been a problem in, for example, that sapphire did not form a single crystal at a portion in contact with the crucible owing to the formation of a complex oxide of lanthanum and aluminum through the reaction of about 0.8 wt % of $La_2O_3$ doped at the same size, with sapphire. However, the coating enabled growth without any problem in quality of sapphire. Specifically, when the coating layer 5 was formed at a powder supply of 30 g/min and a nozzle moving speed of 200 mm/sec, the surface roughness Ra was 14 µm and the number of pores was 56, and sapphire was able to be melted without the reaction between lanthanum oxide doped into molybdenum and sapphire. In addition, adhesion between the crucible and sapphire did not occur, and the crucible was reusable.

That is, in a related-art technology, an oxide dispersion strengthened (ODS) alloy obtained by doping molybdenum with an oxide had problems such as the lowering of the quality such as crystal perfection of sapphire due to a reaction between sapphire and the oxide doped into molybdenum, and the breakage of the molybdenum crucible due to the reaction. However, as described above, the coating layer 5 of this invention suppresses the interaction between the base material 3 and molybdenum, and also suppresses the reaction between alumina and the dopant oxide. Thus, the molybdenum crucible can be formed with the ODS alloy, which has not been applicable heretofore.

Example 3

Figure 11:
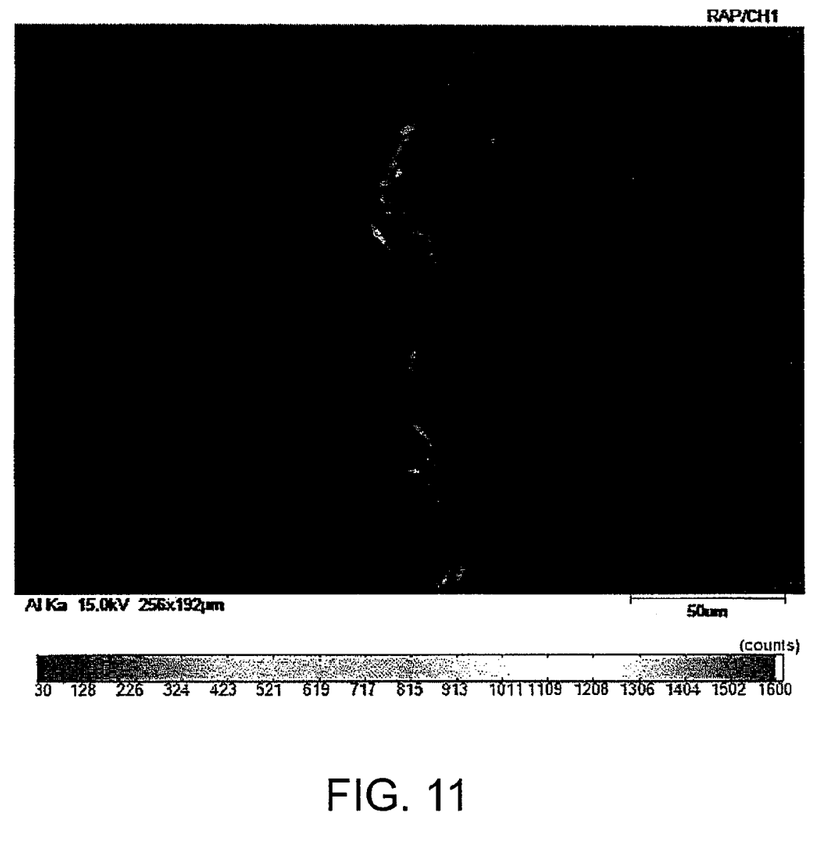
FIG. 11 is a micrograph showing particles remaining on an inner periphery of a base material after shot blasting.

The sample of Example 1 was photographed with EPMA-1720H at an acceleration voltage of 15 kV, and an evaluation was made as to whether or not the particles used in the shot blasting (20 mesh in this example) remained between the base material 3 and the coating layer 5. FIG. 11 shows the result.

As shown in FIG. 11, the particles used in the shot blasting were observed as white spots.

The result revealed that the particles used in the shot blasting remained between the base material 3 and the coating layer 5, indicating that it was preferred to remove the particles.

INDUSTRIAL APPLICABILITY

While this invention has been described above with reference to the embodiments and Examples, this invention is not limited to the above-mentioned embodiments.

It should be understood that a person skilled in the art could arrive at various modification examples and improvement examples within the scope of this invention, and that those modification examples and improvement examples are included in this invention.

REFERENCE SIGNS LIST

1: crucible for growing sapphire single crystal
3: base material
3a: inner surface
3b: bottom surface
4: opening
5: coating layer
6: brim
7: central axis
11: plasma spray gun
α: taper angle

The invention claimed is:

1. A crucible for growing a sapphire single crystal, comprising:
a base material containing molybdenum as a main component and having a crucible shape; and
a coating layer with which an inner periphery of the base material is coated and which is formed of tungsten and inevitable impurities,
wherein the coating layer has a surface roughness Ra of 5 μm or more and 20 μm or less,
wherein a thickness of the coating layer is 50 μm or more and 300 μm or less, and
wherein the coating layer has in itself 10 or more and less than 100 pores in a region corresponding to an area of 50×50 μm in a cross-section of the base material in an axial direction.

2. A crucible for growing a sapphire single crystal according to claim 1, wherein the base material is formed of molybdenum and inevitable impurities.

3. A crucible for growing a sapphire single crystal according to claim 1, wherein the base material is formed of molybdenum doped with La or La oxide, and inevitable impurities.

4. A crucible for growing a sapphire single crystal according to claim 3, wherein the base material includes crystal grains that exhibit an interlocking structure.

5. A crucible for growing a sapphire single crystal according to claim 1, wherein the base material is formed of a tungsten-molybdenum alloy and inevitable impurities.

6. A crucible for growing a sapphire single crystal according to claim 1, wherein the coating layer is formed only on the inner periphery of the base material.

7. A crucible for growing a sapphire single crystal according to claim 1, wherein an inner surface of the base material has a 1° or more and less than 15°.

8. A crucible for growing a sapphire single crystal according to claim 1, wherein the crucible is used for growing a sapphire single crystal by a heat exchange method (HEM method).

9. A method of producing the crucible for growing a sapphire single crystal of claim 1, the method comprising:
(a) subjecting an inner periphery of a base material containing molybdenum as a main component and having a crucible shape to shot blasting; and
(b) forming a coating layer formed of tungsten and inevitable impurities on the inner periphery of the base material by thermal spraying.

10. A method of producing the crucible for growing a sapphire single crystal according to claim 9, wherein the (a) comprises performing the shot blasting with particles passing through a 20-mesh sieve and remaining on a 60-mesh sieve.

11. A method of producing the crucible for growing a sapphire single crystal according to claim 9, wherein the (b) comprises performing the thermal spraying at a moving speed of a thermal spraying nozzle of from 10 to 300 mm/sec and a deposition rate of the coating layer of from 20 to 100 μm per scan.

12. A method of producing the crucible for growing a sapphire single crystal according to claim 9, the method further comprising (c) performing heat treatment at 1,000° C. or more in a vacuum of 10-1 Pa or less or a reducing atmosphere.

13. A method of producing the crucible for growing a sapphire single crystal according to claim 9, wherein the (a) comprises removing particles remaining on a surface of the base material after the shot blasting.

14. A method of producing the crucible for growing a sapphire single crystal according to claim 13, wherein the (a) comprises removing the particles remaining on the surface of the base material after the shot blasting by dissolving the inner periphery of the base material with a chemical solution.

15. A method of producing the crucible for growing a sapphire single crystal according to claim 13, wherein the (a) comprises removing the particles remaining on the surface of the base material after the shot blasting by evaporating the particles together with the surface of the base material through heat treatment in a vacuum-atmosphere furnace.

16. A method of producing the crucible for growing a sapphire single crystal according to claim 13, wherein the (a) comprises removing the particles remaining on the surface of the base material after the shot blasting by performing cleaning with ultrasonic or dry ice.

* * * * *